(12) United States Patent
Bonet

(10) Patent No.: US 6,414,845 B2
(45) Date of Patent: Jul. 2, 2002

(54) MULTIPLE-FAN MODULAR COOLING COMPONENT

(75) Inventor: Sandra E. Bonet, San Jose, CA (US)

(73) Assignee: Hewlett-Packard Co., Palo Alto, CA (US)

(*) Notice: Subject to any disclaimer, the term of this patent is extended or adjusted under 35 U.S.C. 154(b) by 0 days.

(21) Appl. No.: 09/780,593

(22) Filed: Feb. 8, 2001

Related U.S. Application Data

(63) Continuation of application No. 09/316,988, filed on May 24, 1999, now abandoned.

(51) Int. Cl.[7] ................................................. H05K 7/20
(52) U.S. Cl. .................... 361/695; 312/236; 415/213.1; 454/184
(58) Field of Search .............................. 417/360, 423.5, 417/423.7; 415/178, 213.1, 214.1; 454/184; 165/80.3, 121–126; 174/15.1–16.1; 312/236; 361/687, 690, 694, 695, 717–719

(56) References Cited

U.S. PATENT DOCUMENTS

| | | | | |
|---|---|---|---|---|
| 5,101,320 A | * | 3/1992 | Bhargava et al. | 361/694 |
| 5,562,410 A | * | 10/1996 | Sachs et al. | 415/213.1 |
| 5,673,029 A | * | 9/1997 | Behl et al. | 340/635 |
| 5,788,467 A | * | 8/1998 | Zenitani et al. | 417/360 |
| 5,808,867 A | * | 9/1998 | Wang | 361/695 |
| 6,075,697 A | * | 6/2000 | Kerrigan et al. | |
| 6,075,981 A | * | 6/2000 | Hogan et al. | |
| 6,185,097 B1 | * | 2/2001 | Behl | 361/695 |

* cited by examiner

Primary Examiner—Gerald Tolin

(57) ABSTRACT

A modular cooling component for installation in multi-component-bay electronic devices. The modular cooling component includes multiple cooling fans, each positioned to produce an air stream within a component bay of a multi-component-bay electronic device. The cooling fans are internally wired and interconnected to signal lines and power supply lines of the electronic device through a plastic plug-type electrical connector. The modular cooling component is held in place by a thumbscrew.

8 Claims, 4 Drawing Sheets

MULTIPLE-FAN MODULAR COOLING COMPONENT

CROSS-REFERENCE TO RELATED APPLICATION

This application is a continuation of pending U.S. patent application Ser. No. 09/316,988, filed May 24, 1999, now abandoned.

TECHNICAL FIELD

The present invention relates to cooling fans for electronic devices, and, in particular, to a multi-fan modular cooling component that can be easily installed in, and removed from, an electronic device.

BACKGROUND OF THE INVENTION

Modern electronic devices, such as personal computers ("PCs"), servers, network multiplexors, and disk arrays, among others, contain many densely packed heat-producing electronic components, such as power supplies, microprocessor chips, and disk drives. In order to maintain the internal temperature of such electronic devices below temperatures at which electronic components begin to fail, cooling fans are commonly employed to produce air streams. Heat from the internal heat-producing electronic components is transferred to the air streams and dissipated to the environment outside the electronic device. As electronic devices grow more complex, and contain more heat-producing components, the number of internal cooling fans employed to control temperatures within electronic devices has increased. This increasing number of internal cooling fans represents an increasing number of critical failure points within electronic devices, as well as an increasing maintenance overhead.

FIG. 1 shows a portion of the housing an internal support framework of a server computer along with several installed cooling fans. The server computer housing 102 encloses a number of different component bays, including component bay 104 and component bay 106. Proximal portions of the component bays 104 and 106 may contain disk drives, printed circuit boards, or other heat-producing electronic components, and a distal portions of component bays 104 and 106 may contain power supplies or other heat-producing electronic components. A cooling fan 108 is positioned in the middle of bay 104, and a second cooling fan 110 is positioned in the middle of bay 106. Each cooling may draw a current of air over one portion of the bay in which it is installed and force a current of air over the opposite portion of the bay, depending on the direction of rotation of the fan blades and the pitch orientation of the fan blades.

The current techniques for installing cooling fans within electronic devices, such as electronic devices shown in FIG. 1 often require the cooling fans to be separately mounted within the electronic device via attachment devices such as screws 111–115 and brackets 116–118. This, in turn, requires a relatively large number of cooling-fan-related parts, significant assembly time, and a relatively lengthy disassembly and reassembly process for replacing cooling fans or for removing cooling fans in order to diagnose improperly functioning cooling fans. Moreover, modern multi-component-bay electronic devices, such as the device shown in FIG. 1, may be designed for insertion of additional disk drives, printed circuit boards, and power supplies, in a modular fashion, after manufacture of the device. In such cases, either a cooling fan needs to be initially installed in an empty component bay, during manufacture, or a time consuming cooling fan installation needs to precede addition of modular heat-producing components to an initially unused component bay. Thus, manufacturers of electronic devices and electronic device repair and maintenance professionals have recognized the need for an easily installable and removable cooling component for use in multi-component-bay electronic devices. SUMMARY OF THE INVENTION In one embodiment of the present invention, two cooling fans are incorporated into a rectangular fan housing of a modular cooling component ("MCC"). The rectangular fan housing includes a handle to facilitate insertion of the MCC into, and removal of the MCC from, an electronic device. The MCC includes a plastic adapter plug to which both fans are electronically connected to a power supply and to various signal lines of the electronic device. The MCC is held in place by a mounted thumbscrew that mates with a complementary receptacle mounted to a housing of the electronic device into which the MCC is inserted. When the MCC is resident within a multi-component-bay electronic device, the first fan is positioned to produce an air stream within a first component bay of the electronic device and the second fan is positioned to produce an air stream within the second component bay of the electronic device.

DETAILED DESCRIPTION OF THE INVENTION

One embodiment of the present invention is a dual-fan modular cooling component ("MCC") that produces air streams within two side-by-side component bays within an electronic device. The fans within the MCC are internally wired and connected via a plug-type electronic connector to a power supply and various signal lines of the electronic device. The MCC is held in place by a single thumbscrew, and is thus easily installed and removed.

Figure 1:
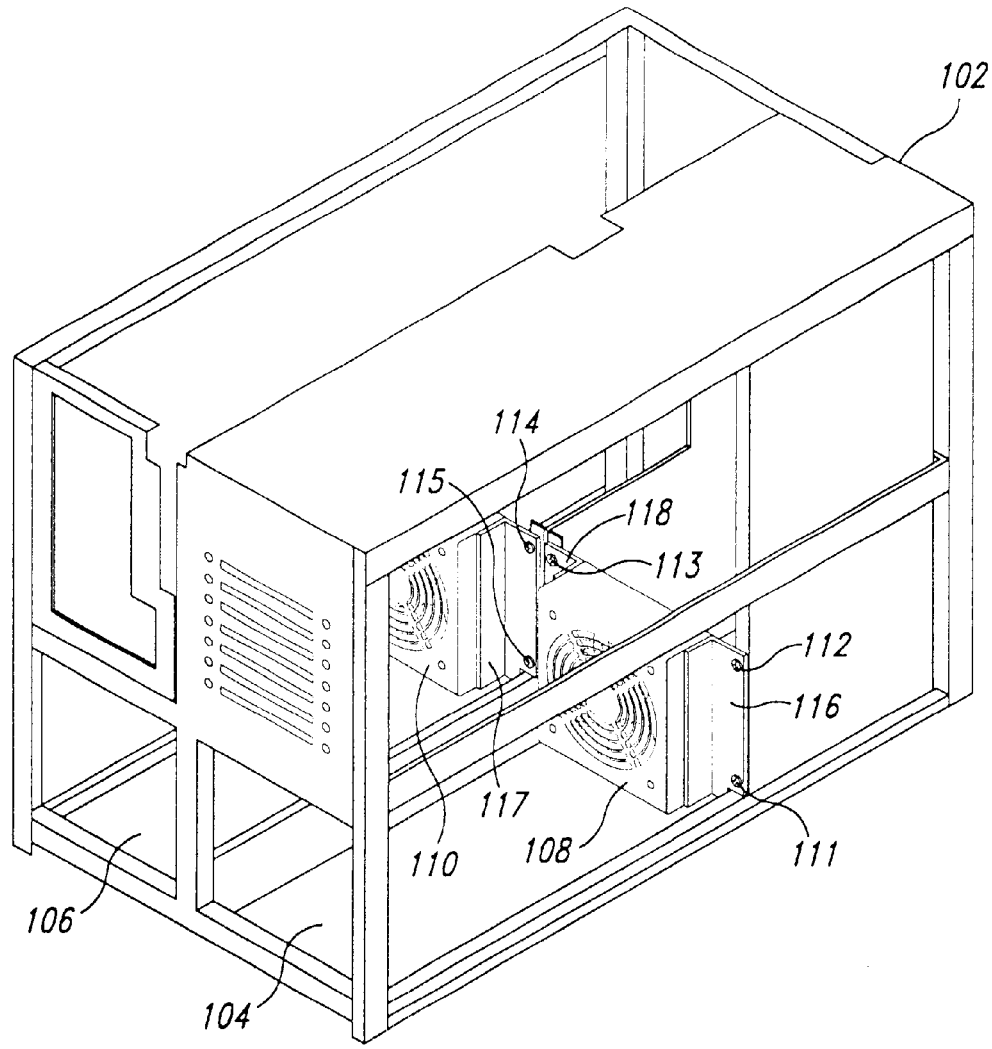
FIG. 1 shows a portion of the external housing and internal support framework of a server computer along with several installed cooling fans.
Figure 2:
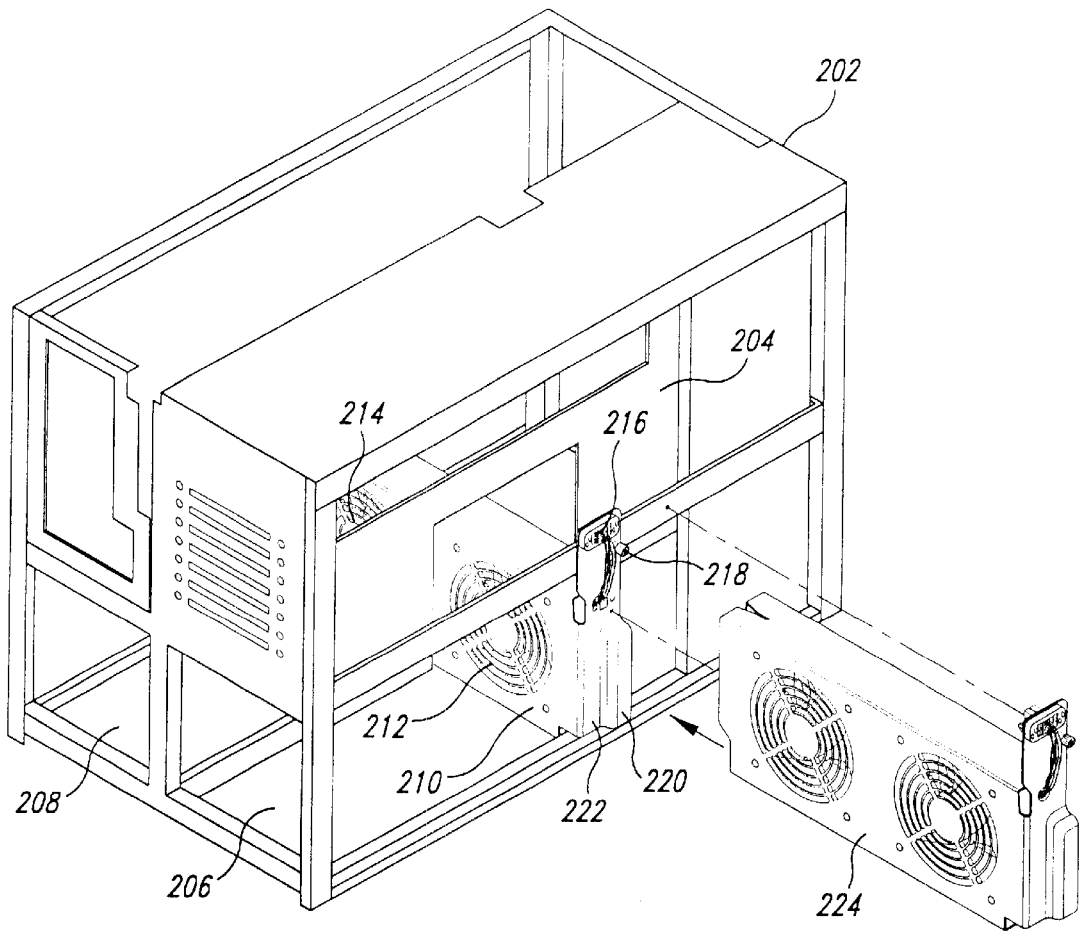
FIG. 2 illustrates positioning of an MCC within a multi-component-bay electronic device.

FIG. 2 illustrates positioning of an MCC within a multi-component-bay electronic device. In FIG. 2, a portion of the external housing 202 and an internal frame component 204 of a multi-component-bay electronic device is shown. This multi-component-bay electronic device includes a first lower component bay 206 and a second lower component bay 208. A first MCC 210 is shown installed within the electronic device. A first fan within the MCC 212 creates an air stream within the first lower component bay 206, and a second fan 214 within the MCC 210 creates an air stream in the second lower component bay 208. The two fans are electronically connected to internal power and signal lines (not shown) of the electronic device via a plug-type electrical connector 216, and the MCC is held in place by a tightened thumbscrew 218. The MCC 210 can be removed from the electronic device housing 202 by untightening the thumbscrew 218 and pulling the MCC horizontally out of the electronic device via a handle 220 incorporated on the external surface 222 of the MCC.

Figure 3:
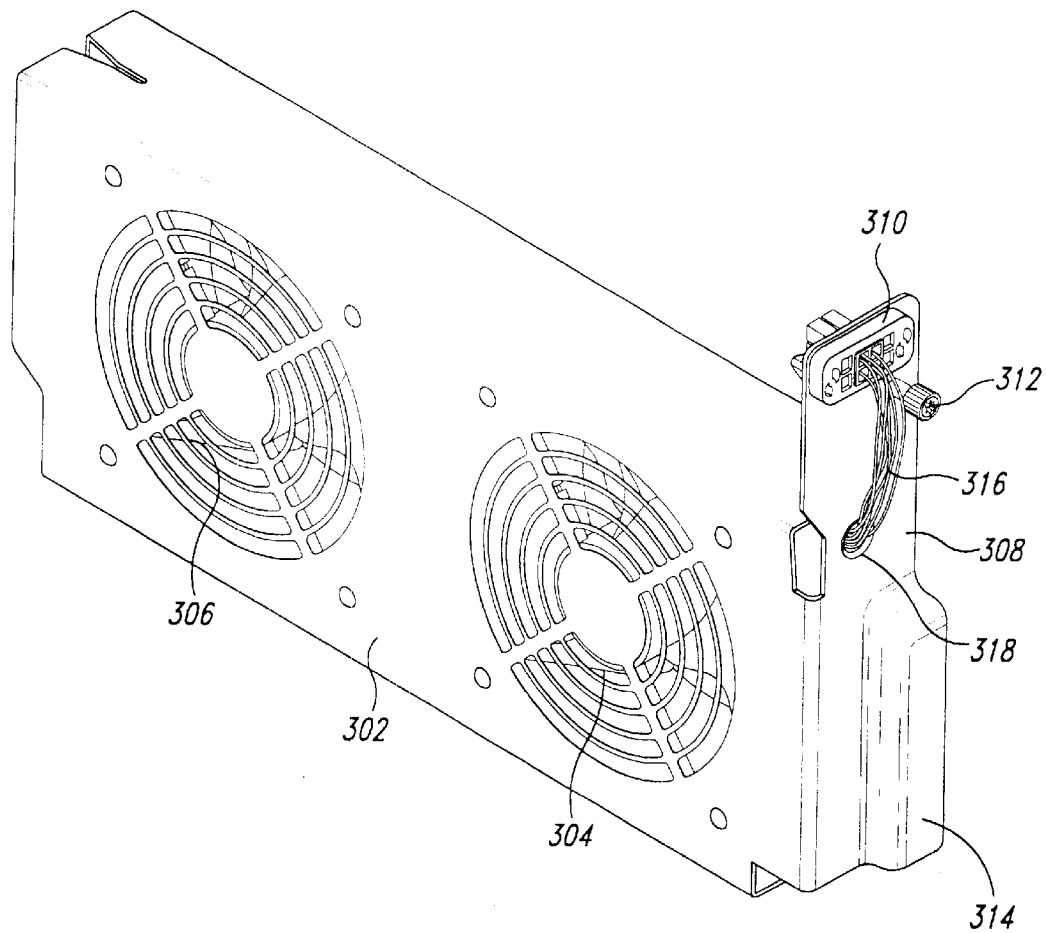
FIG. 3 is a more detailed view of an MCC.

A second MCC 224 may be inserted into the electronic device housing 202 in order to provide backup cooling power for fault tolerance, or for both reasons. For greater fault tolerance, each MCC may be coupled to a separate power supply, so that, in the case that one power supply fails, a second power supply will continue to provide electrical power to at least both MCC FIG. 3 is a more detailed view of an MCC. The MCC comprises a rectangular sheet metal fan housing 302 in which two cooling fans 304 and 306 are mounted. The MCC includes a vertical member 308 to which a plastic plug-type electronic connector 310 and a thumbscrew fastener 312 are mounted. The lower portion of the vertical member is formed into a handle 314 for installing and removing the MCC. Signal and current-carrying wires 316 pass from the plastic plug-type electrical connector 310 through an aperture 318 to terminals and connectors on the cooling fans 304 and 306.

Figure 4:
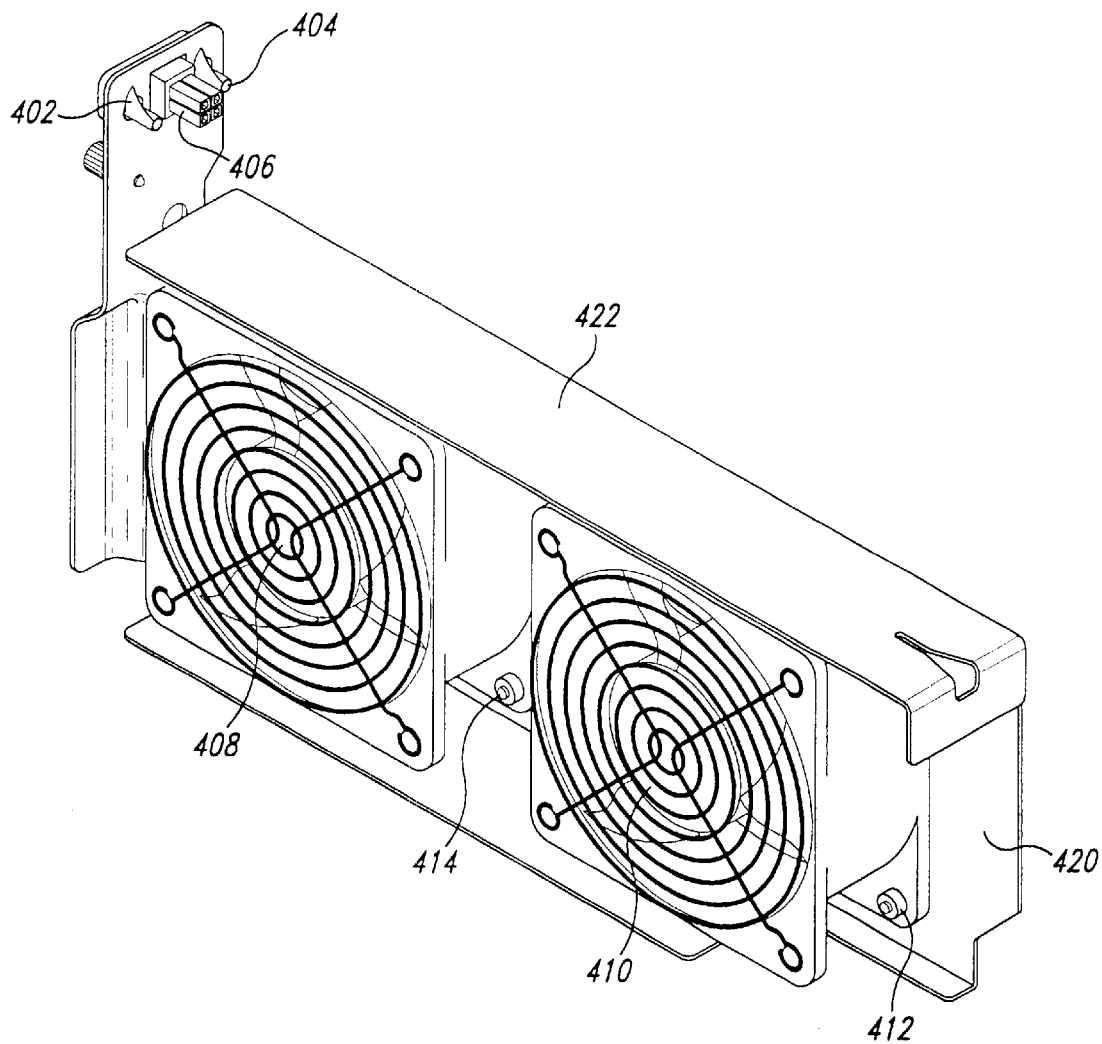
FIG. 4 shows an MCC rotated 180° with respect to the MCC of FIG. 3

FIG. 4 shows the MCC rotated 180° with respect to FIG. 3. The plastic plug-type electrical connector can be seen, in FIG. 4, to include two plastic guide pins 402 and 404 and a square plug-type adapter 406. The cooling fans 408 and 410 are mounted via rivets or some other fastening device 412 and 414 (6 rivets not shown) to the vertical faceplate 420 of the MCC. The MCC includes a single vertical faceplate 420, and thus the cooling fans are partially enclosed by the rectangular sheet metal fan housing 422 of the MCC.

Thus, the MCC is a easily installed and replaced modular component. Installation and removal of the MCC requires far less time than separate cooling fans installed within a multi-component-bay electronic device by current methods. Moreover, the MCC can be removed while an electronic device continues to operate, since a replacement MCC can be immediately installed before the internal temperature of the electronic device rises to dangerous levels.

Although the present invention has been described in terms of a particular embodiment, it is not intended that the invention be limited to this embodiment. Modifications within the spirit of the invention will be apparent to those skilled in the art. For example, the housing of the MCC may be sheet metal, plastic, or other long-lasting formable material. Additional cooling fans may be incorporated within an MCC to cool additional component bays within an electronic device. Cooling fans may be arranged side-by-side, as in FIGS. 2–4, may be arranged vertically, or may be arranged in other patterns in order to provide air streams within multiple component bays having various different orientations.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed, obviously many modifications and variations are possible in view of the above teachings. The embodiments were chosen and described in order to best explain the principles of the invention and its practical applications and to thereby enable others skilled in the art to best utilize the invention and various embodiments with various modifications as are suited to the particular use contemplated. It is intended that the scope of the invention be defined by the following claims and their equivalents:

What is claimed is:

1. A cooling system that cools components of a multi-component electronic device, the cooling system comprising:

two or more separate component bays within the multi-component electronic device, each separate component bay cooled by a separate stream of air flowing through the component bay;

a transverse external opening in a side of the multi-component electronic device aligned transverse to two or more component bays within the multi-component electronic device, said external opening spans the number of separate component bays;

a modular cooling component slideably mounted through said transverse external opening in a direction approximately orthogonal to the side of the multi-component electronic device within the multi-component electronic device and positioned within said two or more component bays and therefore spanning the number of separate component bays, the modular cooling component including a cooling fan positioned within each of the number of component bays, each cooling fan positioned within a single component bay to create the separate stream of air flowing within the component bay, the modular cooling component including an end plate, orthogonal to the direction in which the nodular cooling component is slideably mounted, extending above a top surface of the modular cooling component to form a mounting plate;

a first electrical connector affixed to the mounting plate; and a second, complementary electrical connector mounted within the multi-component electronic device coupled to the first electrical connector in order to provide electrical power from the multi-component electronic device to the modular cooling component, the first electrical connector slideably mating with the second, complementary electrical connector as the modular cooling component is inserted into a final position within the multi-component electronic device.

2. The cooling system of claim 1 wherein the number of separate component bays within the multi-component electronic device are parallel to one another and separated from one another by internal walls within the multi-component electronic device.

3. The cooling system of claim 2 wherein the modular cooling component is position substantially perpendicular to the internal walls and substantially perpendicular to long dimensions of the number of component bays.

4. The cooling system of claim 1 wherein the modular cooling component includes internal power lines that couple motors that drive the cooling fans to the first electrical connector.

5. The cooling system of claim 1 wherein the modular cooling component includes a substantially rectangular housing, the housing comprising:

a front surface including apertures, to each of which a cooling fan is mounted;

a top surface substantially orthogonal to the front surface;

an end plate orthogonal to both the front surface and the top surface, the end plate including a molded handle and extending above a plane of the top surface to form a mounting plate to which the first electrical connector is mounted.

6. The cooling system of claim 5 wherein the modular cooling component housing is formed from a single sheet of rigid material.

7. The cooling system of claim 5 wherein the modular cooling component housing is cut and from a single sheet of metal and folded and shaped to form the front surface, top surface, and end plate.

8. A method for cooling a multi-component electronic device using a modular, slideably insertable and slideably extractable modular cooling component, the method comprising;

provding a transverse external opening in the multi-component electronic device in a side of the multi-component electronic device with dimensions slightly larger than those of an end of the modular cooling component;

providing two or more separate component bays within the multi-component electronic device, each separate component bay cooled by a separate stream of air flowing through the component bay, the number of component bays spanned by one or more internal openings aligned with the external opening; and sliding a modular cooling component into the multi-component electronic device through the transverse external opening in a direction approximately orthogonal to the side of the multi-component electronic device within the multi-component electronic device so that the modular cooling component is positioned within said two or more component bays, thereby spanning the number of separate component bays, the modular cooling component including a cooling fan positioned within each of the member of component bays, each cooling fan positioned, following insertion of the modular cooling component, within a single component bay to create the separate stream of air flowing within the component bay, the modular cooling component including an end plate, orthogonal to the direction in which the modular cooling component is slideably mounted, extending above a top surface of the modular cooling component, to form a mounting plate and a first electrical connector affixed to the mounting plate that slideably mates to a second, complementary electrical connector mounted within the multi-component electronic device to provide electrical power from the multi-component electronic device to the modular cooling component.

* * * * *